(12) United States Patent
Sato et al.

(10) Patent No.: US 7,515,249 B2
(45) Date of Patent: Apr. 7, 2009

(54) SUBSTRATE CARRYING APPARATUS, EXPOSURE APPARATUS, AND DEVICE MANUFACTURING METHOD

(75) Inventors: Kei Sato, Miyagi-ken (JP); Takashi Horiuchi, Kumagaya (JP)

(73) Assignees: Zao Nikon Co., Ltd., Katta-Gun (JP); Nikon Corporation, Tokyo (JP)

( * ) Notice: Subject to any disclaimer, the term of this patent is extended or adjusted under 35 U.S.C. 154(b) by 0 days.

(21) Appl. No.: 11/398,598

(22) Filed: Apr. 6, 2006

(65) Prior Publication Data

US 2006/0250602 A1 Nov. 9, 2006

Related U.S. Application Data

(63) Continuation of application No. PCT/JP2004/014856, filed on Oct. 7, 2004.

(30) Foreign Application Priority Data

Oct. 8, 2003 (JP) ............................ P2003-349551
Dec. 15, 2003 (JP) ............................ P2003-416714

(51) Int. Cl.
*G03B 27/32* (2006.01)
*G03B 27/58* (2006.01)
(52) U.S. Cl. ........................................... 355/72; 355/77
(58) Field of Classification Search .................... 355/52, 355/72, 75, 77, 2
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukuda et al. | |
| 5,825,043 A | 10/1998 | Suwa | |
| 5,874,820 A | 2/1999 | Lee | |
| 2001/0053291 A1 | 12/2001 | Fujita | |
| 2002/0163629 A1 | 11/2002 | Switkes et al. | |
| 2003/0030916 A1 | 2/2003 | Suenaga | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0096760 A1* | 5/2004 | Tateyama et al. | ............. 430/30 |
| 2004/0109237 A1 | 6/2004 | Epple et al. | |
| 2004/0114117 A1 | 6/2004 | Bleeker et al. | |

(Continued)

FOREIGN PATENT DOCUMENTS

DE 221 563 A1 9/1983

(Continued)

*Primary Examiner*—Rodney E Fuller
(74) *Attorney, Agent, or Firm*—Oliff & Berridge, PLC

(57) ABSTRACT

A substrate carrying apparatus, comprises: a first carrying mechanism that carries a substrate into an exposure processing unit that performs exposure processing via a projection optical system and a liquid; a second carrying mechanism that carries a substrate from the exposure processing unit; and an anti-scattering mechanism that controls scattering of the liquid from at least one of the second carrying mechanism and the substrate carried by the second carrying mechanism to at least one of the first carrying mechanism and the substrate carried by the first carrying mechanism.

22 Claims, 11 Drawing Sheets

U.S. PATENT DOCUMENTS

| | | |
|---|---|---|
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derkson et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstra et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Zaal et al. |
| 2005/0225737 A1 | 10/2005 | Weissenrieder et al. |
| 2005/0231694 A1 | 10/2005 | Kolesnychenko et al. |
| 2005/0233081 A1 | 10/2005 | Tokita |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259236 A1 | 11/2005 | Straauer |
| 2005/0264778 A1 | 12/2005 | Lof et al. |
| 2005/0270505 A1 | 12/2005 | Smith |
| 2006/0007419 A1 | 1/2006 | Streefkerk et al. |

FOREIGN PATENT DOCUMENTS

| | | |
|---|---|---|
| DE | 224 448 A1 | 7/1985 |
| JP | A 57-153433 | 9/1982 |
| JP | A 58-202448 | 11/1983 |
| JP | A 59-019912 | 2/1984 |
| JP | A 62-065326 | 3/1987 |
| JP | A 63-157419 | 6/1988 |
| JP | A-63-232433 | 9/1988 |
| JP | A 04-305915 | 10/1992 |
| JP | A 04-305917 | 10/1992 |
| JP | A 05-062877 | 3/1993 |
| JP | A-06-124873 | 5/1994 |
| JP | A 06-124873 | 5/1994 |
| JP | A-06-168866 | 6/1994 |
| JP | A 07-220990 | 8/1995 |
| JP | A 08-166475 | 6/1996 |
| JP | A 08-316125 | 11/1996 |
| JP | A 08-330224 | 12/1996 |
| JP | A 10-303114 | 11/1998 |
| JP | A 10-340846 | 12/1998 |
| JP | A 11-176727 | 7/1999 |
| JP | A 2000-058436 | 2/2000 |
| WO | WO 99/49504 A1 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A1 | 1/2005 |
| WO | WO 2005/003864 A2 | 1/2005 |
| WO | WO 2005/006026 A2 | 1/2005 |

| | | | |
|---|---|---|---|
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A1 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

* cited by examiner

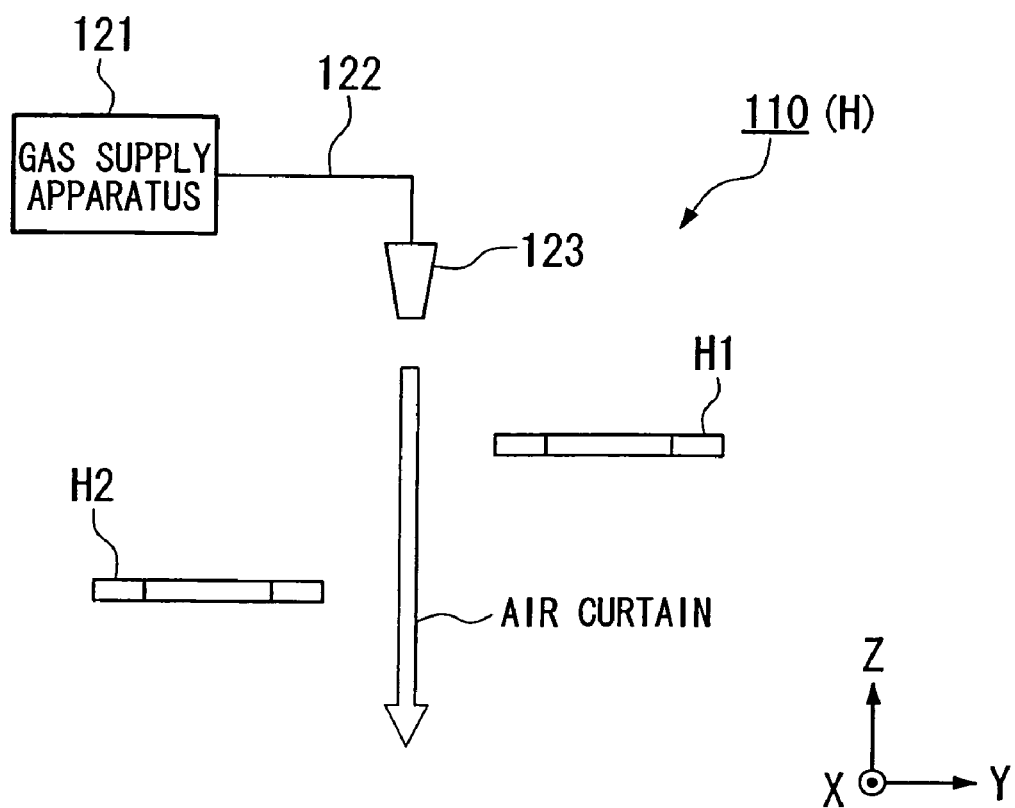

… (1)

SUBSTRATE CARRYING APPARATUS, EXPOSURE APPARATUS, AND DEVICE MANUFACTURING METHOD

CROSS-REFERENCE TO RELATED APPLICATIONS

This is a Continuation Application of International Application No. PCT/JP2004/014856, filed Oct. 7, 2004, which claims priority to Japanese Patent Application No. 2003-349551 filed on Oct. 8, 2003 and Japanese Patent Application No. 2003-416714 filed on Dec. 15, 2003. The contents of the aforementioned applications are incorporated herein by reference.

BACKGROUND OF THE INVENTION

1. Field of the Invention

The present invention relates to a technology that fills at least a portion of the space between a projection optical system and a substrate with a liquid and exposes a pattern on the substrate via the projection optical system and the liquid and particularly to a substrate carrying apparatus, an exposure apparatus and a device manufacturing method.

2. Description of Related Art

Semiconductor devices and liquid crystal display devices are manufactured by a so-called photolithography technique by which a pattern formed on a mask is transferred onto a photosensitive substrate. The exposure apparatus used in this photolithography process has a mask stage that supports a mask and a substrate stage that supports a substrate, and it transfers the pattern of a mask to the substrate via a projection optical system while sequentially moving the mask stage and the substrate stage. In recent years, higher resolutions for projection optical systems have been in demand to handle the even higher integration of device patterns. The resolution of the projection optical system is higher the shorter the exposure wavelength used and the larger the numerical aperture of the projection optical system used. For this reason, the exposure wavelength used in exposure apparatuses has become shorter year by year, and the numerical aperture of the projection optical system is also increasing. In addition, the mainstream exposure wavelength at present is the 248 nm of a KrF excimer laser, but a shorter wavelength, the 193 nm of an ArF excimer laser, is also coming into practical application. In addition, when exposure is performed, the depth of focus (DOF) is also important as well as the resolution. The resolution R and the depth of focus δ are expressed by the respective equations below.

$$R = k_1 \cdot \lambda / NA \quad \ldots (1)$$

$$\delta = k_2 \cdot \lambda / NA^2 \quad \ldots (2)$$

Here, $\lambda$ is the exposure wavelength, NA is the numerical aperture of the projection optical system, and $k_1$ and $k_2$ are process coefficients. Based on Equation (1) and Equation (2), it is apparent that when the exposure wavelength $\lambda$ is made shorter and the numerical aperture NA is made larger in order to increase the resolution R, the depth of focus δ becomes narrower.

When the depth of focus δ is too narrow, it is difficult to match the substrate surface to the image plane of the projection optical system, and there is concern that the focus margin during the exposure operation will be insufficient. Therefore, the liquid immersion method disclosed in PCT International Publication WO 99/49504 noted below, for example, has been proposed as a method of substantially shortening the exposure wavelength and increasing the depth of focus. In this liquid immersion method, the space between the lower surface of the projection optical system and the substrate surface is filled with a liquid such as water or an organic solvent, and the fact that the wavelength of the exposure light in liquid becomes 1/n in air (n is normally approximately 1.2 to 1.6 at the refractive index of the liquid) is used to increase the resolution while increasing the depth of focus to approximately n times.

In any case, in the exposure apparatus, for the purpose of making the apparatus more compact, the carry-in path (loader space) by which the substrate is carried into the exposure processing unit and the carry-out path (unloader space) by which the substrate is carried out of the exposure processing unit are often arranged near each other. However, in the aforementioned liquid immersion method, there is a possibility that liquid is adhering to the post-exposure processing substrate, and there is concern that this liquid will scatter during carrying of the substrate and adhere to the substrate being carried to the exposure processing unit and/or to the carrying member that carries the pre-exposure processing substrate.

When liquid that has scattered from the post-exposure processing substrate and/or from the carrying member that carries this substrate adheres to the pre-exposure processing substrate, the adhered liquid collects impurities included in the surrounding gas and contaminates the pre-exposure processing substrate. In addition, when liquid adheres to the carrying member for loading, there is a possibility that the next pre-exposure processing substrate will be contaminated. When the liquid that has adhered to the substrate has dried before exposure processing as well, the mark thereof remains on the surface of the substrate, which tends to degrade exposure accuracy.

The present invention has been made taking the above circumstances into account, and its object is to provide a substrate carrying apparatus that is able to prevent liquid from adhering to the substrate which is to be exposed based on the liquid immersion method and to the member that carries the pre-exposure processing substrate.

In addition, another object of the present invention is to provide an exposure apparatus that is able to perform exposure processing based on the liquid immersion method with high accuracy.

Also, another object of the present invention is to provide a device manufacturing method that is capable of manufacturing high quality devices.

SUMMARY OF THE INVENTION

The substrate carrying apparatus of the present invention comprises: a first carrying mechanism that carries a substrate into an exposure processing unit that performs exposure processing via a projection optical system and a liquid; a second carrying mechanism that carries said substrate out of said exposure processing unit; and an anti-scattering mechanism that controls scattering of said liquid from at least one of said second carrying mechanism and the substrate carried by said second carrying mechanism to at least one of said first carrying mechanism and the substrate carried by said first carrying mechanism.

Here, said anti-scattering mechanism has, for example, a partition member provided between the carrying space of said first carrying mechanism and the carrying space of said second carrying mechanism.

Or, said anti-scattering mechanism has a partition member that has an aperture part, which connects at least a portion of the carrying space of said first carrying mechanism and the carrying space of said second carrying mechanism, and an opening and closing member that opens and closes said aperture part.

In addition, said anti-scattering mechanism has an isolation mechanism (130) that, while said second carrying mechanism carries said substrate to which said liquid has adhered, isolates said first carrying mechanism that carries the substrate before said liquid adheres from the carrying path of said second carrying mechanism.

In addition, said anti-scattering mechanism may form an air curtain between the carrying space of said first carrying mechanism and the carrying space of said second carrying mechanism.

In addition, said anti-scattering mechanism may have a first substrate accommodation container that is provided to said first carrying mechanism and accommodates the substrate before said liquid adheres.

Also, said anti-scattering mechanism may have a second substrate accommodation container that is provided to said second carrying mechanism and accommodates the substrate after said liquid has adhered.

According to the substrate carrying apparatus of the present invention, scattering of the liquid from at least one of the second carrying mechanism and said substrate carried by the second carrying mechanism to at least one of the first carrying mechanism and said substrate carried by the first carrying mechanism is controlled, so adherence of liquid to the first carrying mechanism or a substrate carried by the first carrying mechanism is prevented. Specifically, before exposure processing based on the liquid immersion method, the adherence of liquid and/or foreign objects to the substrate is prevented.

In addition, the substrate carrying apparatus of the present invention comprises: a first accommodation container that accommodates a substrate to which the liquid has adhered and a second accommodation container that accommodates a substrate to which the liquid is not adhering.

Also, the exposure apparatus (EX-SYS) of the present invention is an exposure apparatus comprising an exposure processing unit that, in a status where at least a portion of the space between the projection optical system and the substrate has been filled with a liquid, projects an image of a pattern formed on a mask (M) onto said substrate to expose said substrate, and further comprising said substrate carrying apparatus.

In addition, the device manufacturing method of the present invention uses said exposure apparatus.

According to the substrate carrying apparatus of the present invention, it is possible to prevent liquid and/or foreign objects from adhering to the substrate which is to be exposed based on the liquid immersion method by providing an anti-scattering mechanism.

In addition, according to the exposure apparatus of the present invention, liquid and/or foreign objects are prevented from adhering to the substrate which is to be exposed based on the liquid immersion method during substrate carrying, so it is possible to perform exposure processing with high accuracy.

Also, according to the device manufacturing method of the present invention, it is possible to manufacture high quality devices using exposure processing based on the liquid immersion method.

BRIEF DESCRIPTION OF THE DRAWINGS

FIG. 7 is a drawing that schematically shows another example of the configuration of the anti-scattering mechanism.

DETAILED DESCRIPTION OF THE INVENTION

Figure 1:
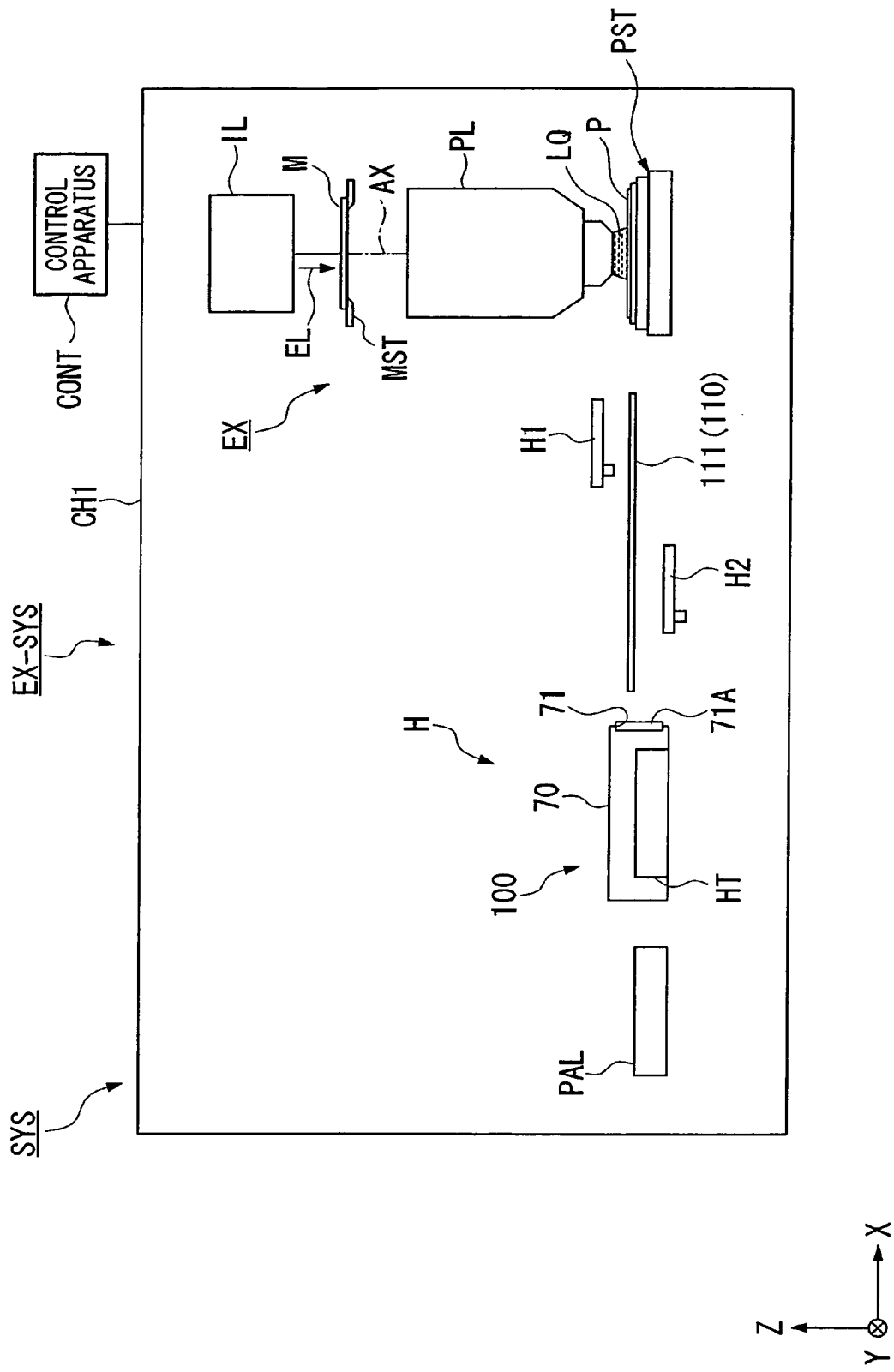
FIG. 1 is a schematic block diagram that shows an embodiment of a device manufacturing system comprising the exposure apparatus of the present invention.

The substrate carrying apparatus and exposure apparatus of the present invention will be explained below while referring to the drawings. FIG. 1 is a drawing that shows an embodiment of the device manufacturing system that is provided with the exposure apparatus of the present invention, and it is a schematic block diagram as seen from the side, and FIG. 2 is a drawing of FIG. 1 as seen from above.

Figure 2:
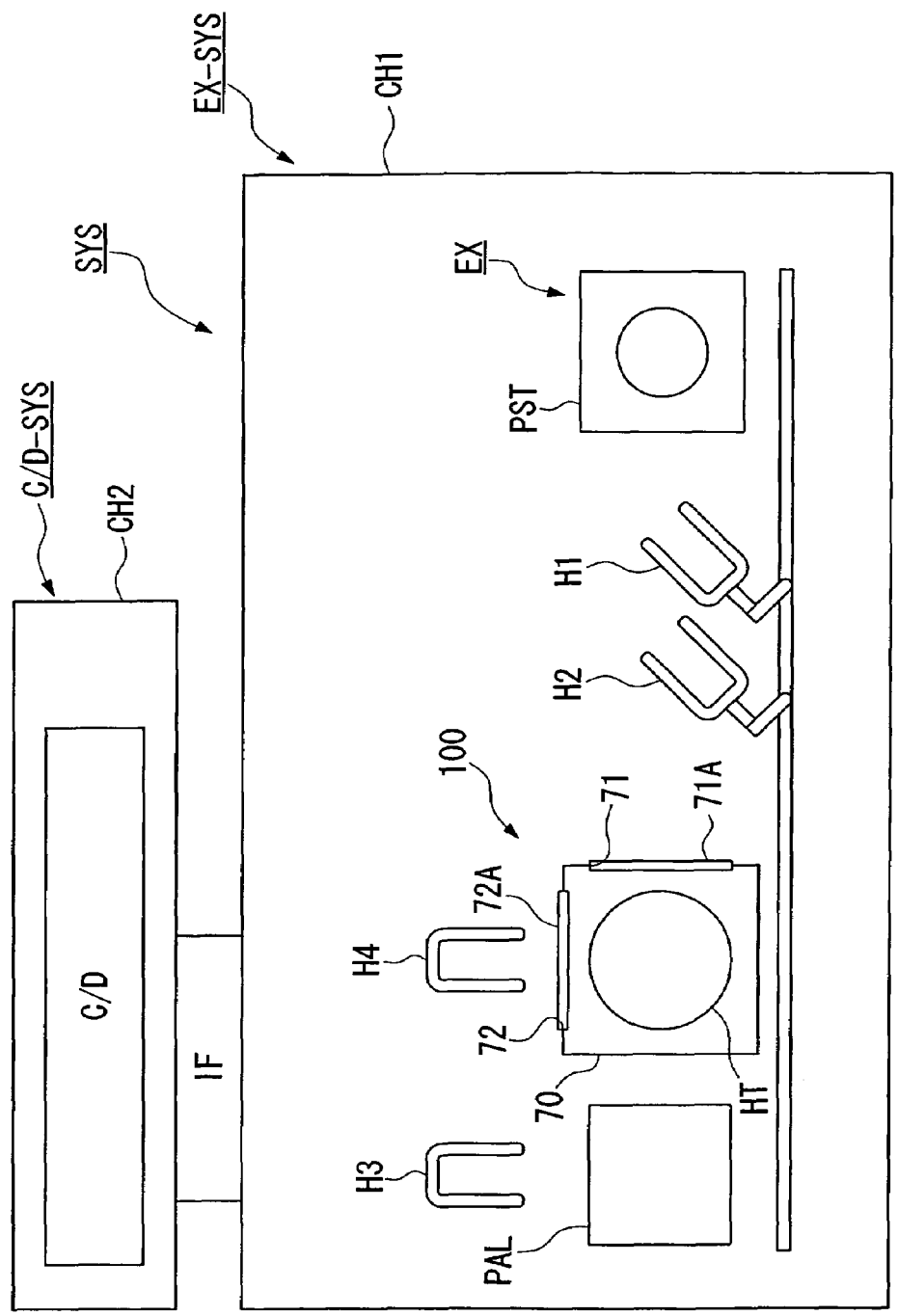
FIG. 2 is a drawing of FIG. 1 as seen from above.

In FIG. 1 and FIG. 2, the device manufacturing system SYS is provided with an exposure apparatus EX-SYS and a coater/developer apparatus C/D-SYS. The exposure apparatus EX-SYS is provided with an interface part I/F that forms the connection part with the coater/developer apparatus C/D-SYS, an exposure apparatus main body EX that fills the space between a projection optical system PL and a substrate P with a liquid LQ and projects a pattern formed on a mask onto a substrate P via the projection optical system PL and the liquid LQ to expose the substrate P, a carrying system H that carries the substrate P between the interface part IF and the exposure apparatus main body EX, a liquid removal system 100 that removes liquid LQ that has adhered to the surface of the substrate P, and a control apparatus CONT that comprehensively controls operation of the entire exposure apparatus EX-SYS. The coater/developer apparatus C/D-SYS is provided with a coating apparatus C, which coats photoresist (photosensitive agent) onto the base material of the substrate P prior to exposure processing being performed, and a development apparatus (processing apparatus) D, which performs development processing of the substrate P after exposure processing has been performed at the exposure apparatus main body EX. The exposure apparatus main body EX is arranged inside a first chamber apparatus CH1 in which cleanliness level is controlled. On the other hand, the coating apparatus C and the development apparatus D are arranged inside a second chamber apparatus CH2 that is separate from the first chamber apparatus CH1. In addition, the first chamber apparatus CH1, which accommodates the exposure apparatus main body EX, and the second chamber apparatus CH2, which accommodates the coating apparatus C and the development apparatus D, are connected via the interface part IF. Here, in the following explanation, the coating apparatus C and the development apparatus D accommodated inside the second chamber apparatus CH2 are appropriately named together as "coater/developer main body C/D."

As shown in FIG. 1, the exposure apparatus main body EX is provided with an illumination optical system IL that illuminates a mask M supported on a mask stage MST with exposure light EL, a projection optical system PL that projects the pattern image of the mask M illuminated by the exposure light EL onto a substrate P, and a substrate stage PST that holds the substrate P. In addition, the exposure apparatus main body EX of the present embodiment is a scanning type exposure apparatus (a so-called scanning stepper) that exposes a pattern formed on the mask M while simultaneously moving the mask M and the substrate P in mutually different directions (opposite directions) in the scan direction. In the following explanation, the simultaneous movement direction (scan direction) of the mask M and the substrate P in the horizontal plane is the X direction, the direction perpendicular to the X axis direction within the horizontal plane is the Y axis direction (non-scan direction), and the direction that matches the optical axis AX of the projection optical system PL vertically in the X axis direction and the Y axis direction is the Z axis direction. In addition, the directions of rotation (inclination) about the X axis, the Y axis and the Z axis are considered to be θX, θY and θZ respectively. Note that "substrate" discussed here includes those in which a resist has been coated onto a semiconductor wafer, and "mask" includes reticles on which a device pattern that is to be reduction-projected onto a substrate is formed.

The carrying system H includes a first arm H1 that carries (loads) the substrate P prior to exposure processing being performed to the substrate stage PST and a second arm H2 that carries (unloads) the substrate P after exposure processing has been performed out of the substrate stage PST. The pre-exposure processing substrate P that has been carried from the coating apparatus C is transferred to a third arm H3 via the interface part IF. The third arm H3 transfers the substrate P to a prealignment unit PAL. The prealignment part PAL performs rough alignment of the substrate P with respect to the substrate stage PST. A substrate P that has been aligned by the prealignment unit PAL is loaded to the substrate stage PST by the first arm H1. The substrate P for which exposure processing has been completed is unloaded from the substrate stage PST by the second arm H2. The second arm H2 transfers the post-exposure processing substrate P to a holding table HT provided on the carrying path of that substrate P. The holding table HT constitutes a portion of the liquid removal system 100, and it temporarily holds the transferred substrate P. The holding table HT is arranged inside a cover member 70, and provided on the cover member 70 are aperture parts 71 and 72 that allow the carried substrate P to pass through. Provided on the aperture parts 71 and 72 are shutter parts 71A and 72A, which open and close the aperture parts 71 and 72.

The holding table HT is able to hold and rotate the substrate P, and the substrate P whose direction has been changed due to the rotation of that holding table HT is held by a fourth arm H4 and is carried to the interface part IF. The substrate P that has been conveyed to the interface part IF is delivered to the development apparatus D. The development apparatus D performs development processing for the delivered substrate P.

In addition, the first to fourth arms H1-H4, the prealignment unit PAL and the holding table HT are arranged inside the first chamber apparatus CH1. Here, an aperture part and a shutter that opens and closes this aperture part are provided on a portion that faces the respective interface parts IF of the first and second chamber apparatuses CH1 and CH2. The shutter is released during the operation of carrying the substrate P to the interface part IF.

The first arm H1 holds the substrate P prior to exposure processing being performed and loads it to the substrate stage PST. On the other hand, the second arm H2 holds the substrate P after liquid immersion exposure processing has been performed on which the liquid LQ may be adhering and unloads it from the substrate stage PST. In this way, since the first arm H1, which carries the pre-exposure processing substrate P is used separately from the second arm H2, which carries the post-exposure processing substrate P on which the liquid LQ may be adhering, the liquid LQ does not adhere to the first arm H1, and it is possible to prevent the adhesion of liquid LQ and/or impurities to, for example, the rear surface of the substrate P that is to be loaded to the substrate stage PST. Therefore, even in a configuration in which the substrate holder of the substrate stage PST holds the substrate P by vacuum suction, it is possible to prevent the occurrence of a nonconformity in which the liquid LQ penetrates to a vacuum system such as a vacuum pump via the suction holes of the substrate holder.

Here, in the carrying system H of the present example, the second arm H2, which carries the substrate from the substrate stage PST, is arranged below the first arm H1, which carries the substrate to the substrate stage PST, which is a part of the exposure processing unit. This is because the liquid, that has adhered to the post-exposure processing substrate carried by the second arm H2, is prevented from dropping to at least one of the first arm H1 and the pre-exposure processing substrate P carried by the first arm H1, and that liquid is prevented from adhering to the pre-exposure processing substrate carried by the first arm H1. In addition, the carrying system H of the present embodiment includes an anti-scattering mechanism 110 that controls scattering of the liquid from at least one of the second arm H2 and the substrate carried by the second arm H2 to at least one of the first arm H1 and the substrate P carried by the first arm H1.

Figure 3:
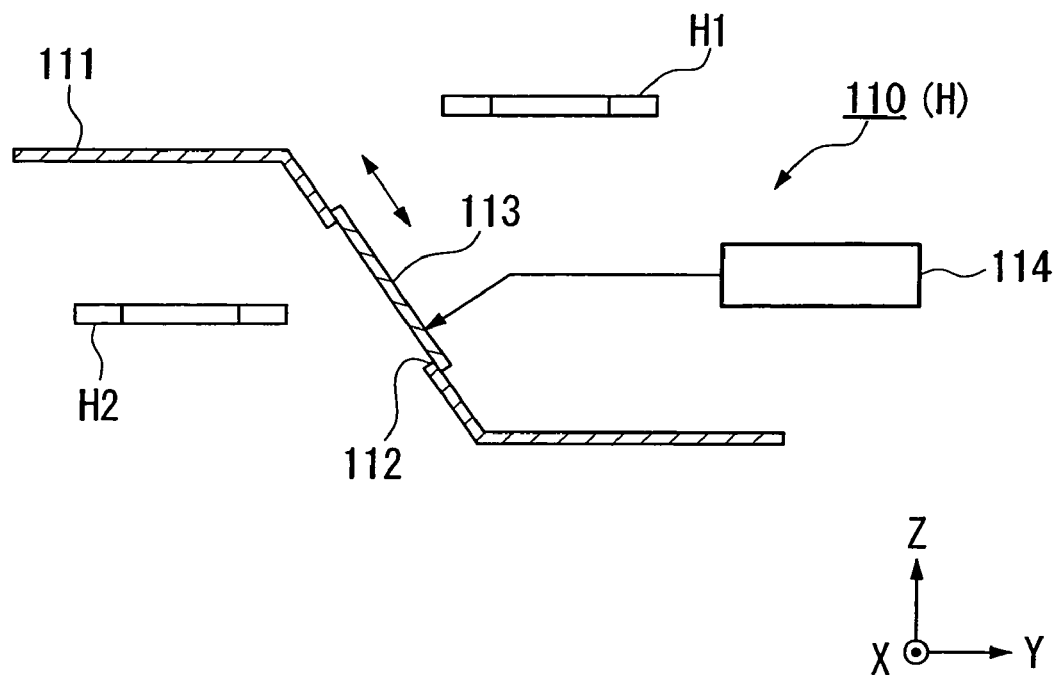
FIG. 3 is a drawing that schematically shows an example of the configuration of the anti-scattering mechanism.

FIG. 3 schematically shows an example of the configuration of the anti-scattering mechanism 110.

In FIG. 3, the anti-scattering mechanism 110 is configured to include a partition member 111 provided between the carrying space of the first arm H1 and the carrying space of the second arm H2, an opening and closing member 113 that opens and closes an aperture part 112 formed on this partition member 111, and a drive apparatus 114 that drives the opening and closing member 113.

The partition member 111 is constituted by a plate-shaped member, and it is such that a wall is provided between the carrying space of the first arm H1 and the carrying space of the second arm H2, and the direct flow of gas between the two spaces is blocked. Also, the partition member 111 is arranged so as not to obstruct the movement of the respective arms H1 and H2, and an aperture part 112 that communicates a portion of the carrying space of the first arm H1 and the carrying space of the second arm H2 is formed on the partition member 111. This aperture part 112 is for avoiding interference between the respective arms H1 and H2 and the partition member 111 at the time of substrate conveyance, and the position at which it is formed, its size, and the number thereof are appropriately determined based on the respective operations of the first arm H1 and the second arm H2. In addition, an opening and closing member 113 is arranged on the aperture part 112 of the partition member 111 so that it is able to freely slide, and this opening and closing member 113 is driven by a drive apparatus 114. Note that if a slidability improvement agent is used on a sliding part such as the opening and closing member 113, substances with which the generation of volatile substances (organic substances such as carbides) is controlled, for example, fluorine group grease, etc. are used.

In the carrying system H with the above configuration, even though there is concern that liquid from the post-exposure processing substrate being carried by the second arm H2 will scatter due to such influences as gas flow within chamber CH1 (see FIG. 2), adherence of liquid to the first arm H1 or to the substrate being carried by the first arm H1 is prevented by the anti-scattering mechanism 110. That is, even assuming that liquid is scattered from the substrate on the second arm H2, movement of that liquid in the air is blocked by the partition member 111, and adherence of the liquid to the first arm H1 or the substrate being carried by the first arm H1 is prevented.

Note that, during such times as handover of the substrate, the opening and closing member 113 of the aperture part 112 goes into an appropriate open status, and the movement operations of the arms H1 and H2 are performed via the aperture part 112. Therefore, interference between the arms H1 and H2 and the partition member 111 is avoided.

Figure 4:
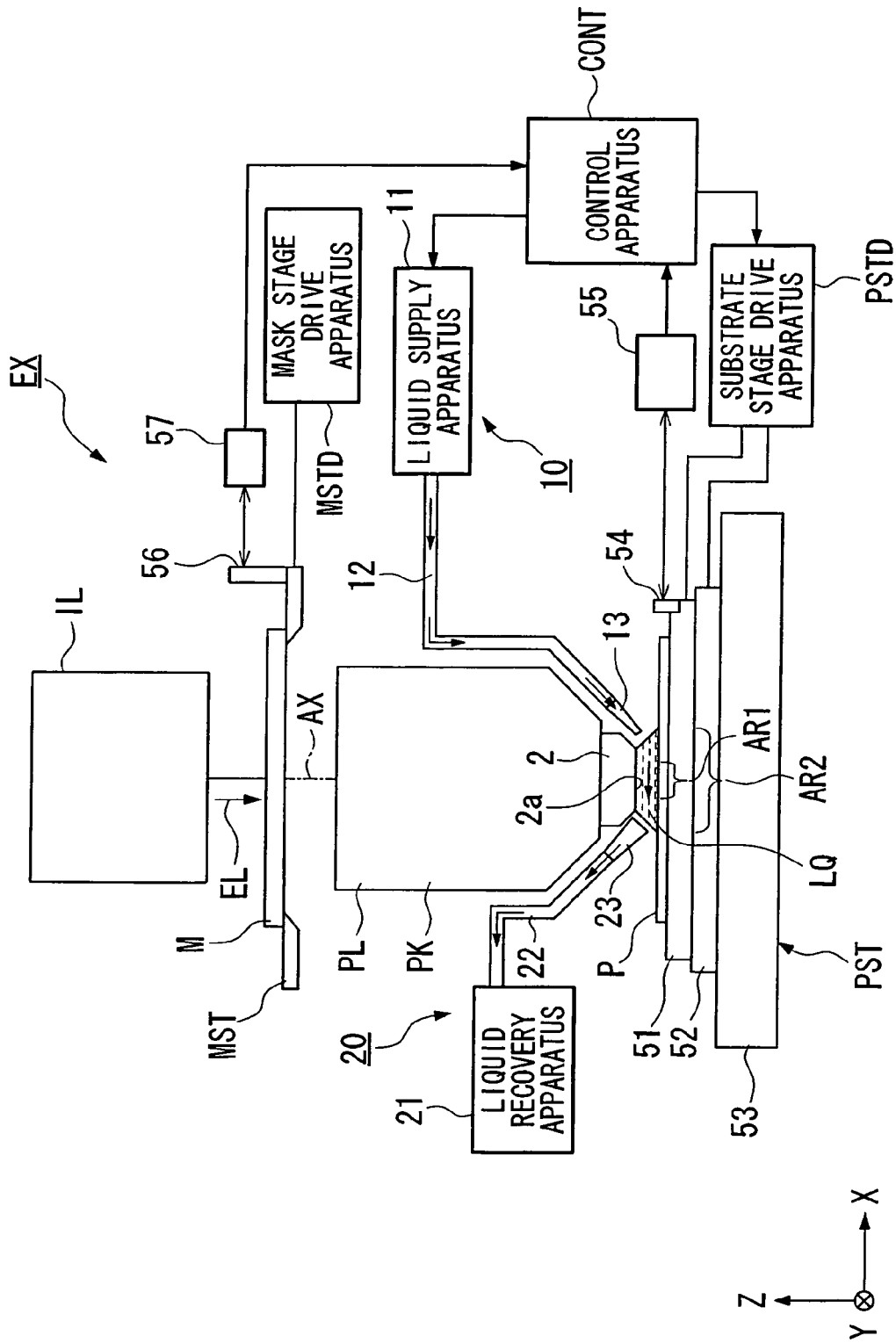
FIG. 4 is a schematic block diagram that shows an embodiment of the exposure apparatus main body that performs exposure processing.

FIG. 4 is schematic block diagram of the exposure apparatus main body EX.

The illumination optical system IL illuminates the mask M supported on the mask stage MST using exposure light EL and has an exposure light source, an optical integrator that makes the illumination intensity of the luminous flux that has emitted from the exposure light source uniform, a condenser lens that condenses the exposure light EL from the optical integrator, a relay lens system, and a variable field stop that sets the region of illumination on the mask resulting from the exposure light EL to a slit shape. The prescribed illumination region on the mask M is illuminated by exposure light EL with a uniform illumination distribution by means of the illumination optical system IL. For the exposure light EL that emerges from the illumination optical system IL, for example, deep ultraviolet light (DUV light) such as ultraviolet band bright lines (g-rays, h-rays, i-rays) emerges from a mercury lamp and KrF excimer laser light (wavelength of 248 nm) or vacuum ultraviolet light (VUV light) such as ArF excimer laser light (wavelength of 193 nm) and $F_2$ laser light (wavelength of 157 nm) are used. In the present embodiment, the case in which ArF excimer laser light is used is explained as an example.

The mask stage MST supports the mask M, and it is capable of two-dimensional movement within a plane perpendicular to the optical axis AX of the projection optical system PL, that is, within the XY plane, and it is capable of finely rotating in the θZ direction. The mask stage MST is driven by a mask stage drive apparatus MSTD such as a linear motor. The mask stage drive apparatus MSTD is controlled by a control apparatus CONT. A movable mirror 56 is provided on the mask stage MST, and a laser interferometer 57 is provided at a position that opposes the movable mirror 56. The position in the two-dimensional direction and the angle of rotation of the mask stage MST that supports the mask M are measured in real time by the laser interferometer, and the measurement results are output to the control apparatus CONT. The control apparatus CONT positions the mask M supported on the mask stage MST by driving the mask stage drive apparatus MSTD based on the measurement results of the laser interferometer.

The projection optical system PL projection-exposes the pattern of the mask M onto the substrate P at the prescribed magnification ratio β, and it is configured by a plurality of optical elements (lenses and/or mirrors), and these optical elements are accommodated within a lens barrel PK. In the present embodiment, the projection optical system PL is a reduction system in which the projection magnification β is 1/4 or 1/5, for example. Note that the projection optical system PL may be either a magnification system or an enlargement system. At the front end side (substrate P side) of the projection optical system PL of the present embodiment, an optical element (lens) 2 is protruded from the lens barrel PK. This optical element 2 is detachably (exchangeably) provided to the lens barrel PK.

The optical element 2 is formed of fluorite. Fluorite has high affinity for purified water, so it is possible to make the liquid LQ contact with nearly the entire front end surface (liquid contact surface) 2a of the optical element 2. Specifically, in the present embodiment, the liquid (water) LQ that has high affinity with the liquid contact surface 2a of the optical element 2 is supplied, so the contact degree between the liquid LQ and the liquid contact surface 2a of the optical element 2 is high.

Note that the optical element 2 may be quartz that has high affinity with water. In addition, hydrophilic (lyophilic) treatment may be performed on the liquid contact surface 2a of the optical element 2 to further increase affinity with the liquid LQ.

The substrate stage PST supports the substrate P, and it includes a Z stage 51 that holds the substrate P via a substrate holder, an XY stage 52 that supports the Z stage 51, and a base 53 that supports the XY stage 52. The substrate stage PST is driven by a substrate stage drive apparatus PSTD such as a linear motor. The substrate stage drive apparatus PSTD is controlled by the control apparatus CONT. The position (focus position) of the substrate P held on the Z stage 51 in the Z axis direction and the positions in the θX and θY directions are controlled by driving the Z stage 51. In addition, the position of the substrate P in the XY direction (the position in a direction essentially parallel to the image plane of the projection optical system PL) is controlled by driving the XY stage 52. That is, the Z stage 51 controls the focus position and the angle of inclination of the substrate P to align the surface of the substrate P with the image plane of the projection optical system PL by means of an autofocus system and an auto leveling system, and the XY stage 52 performs positioning of the substrate P in the X axis direction and the Y axis direction. Note that it goes without saying that the Z stage and the XY stage may be provided as a unit.

A movable mirror 54 is provided on the substrate stage PST (Z stage 51). In addition, a laser interferometer 55 is provided at a position that opposes the movable mirror 54. The position in the two-dimensional direction and the angle of rotation of the substrate P on the substrate stage PST are measured in real time by the laser interferometer 55, and the measurement results are output to the control apparatus CONT. The control apparatus CONT positions the substrate P supported on the substrate stage PST by driving the substrate stage drive apparatus PSTD based on the measurement results of the laser interferometer 55.

In the present embodiment, a liquid immersion method is applied to, with the exposure wavelength being substantially shortened, improve the resolution, and to widen the depth of focus. For this reason, the prescribed liquid LQ is filled in the space between the surface of the substrate P and the front end surface 2a of the optical element 2 of the projection optical system PL at least while pattern image of the mask M is being transferred onto the substrate P. In the above way, the optical element 2 is protruded on the front end side of the projection optical system PL, and the configuration is such that the liquid LQ only comes into contact with optical element 2. Through this, corrosion of lens barrels PK consisting of metal is prevented. In the present embodiment, purified water is used as the liquid LQ. Purified water is able to transmit exposure light EL not only in the case of ArF excimer laser light but even in cases where, for example, deep ultraviolet light (DUV light) such as ultraviolet band bright lines (g-rays, h-rays, i-rays) emerging from a mercury lamp and KrF excimer laser light (wavelength of 248 nm) are used as the exposure light EL.

The exposure apparatus main body EX has a liquid supply mechanism 10 that supplies the liquid LQ to the space between the substrate P and the front end surface 2a of optical element 2 of the projection optical system PL and a liquid recovery mechanism 20 that recovers the liquid LQ on the substrate P. The liquid supply mechanism 10 includes a supply nozzle 13 that supplies the prescribed liquid LQ to form a liquid immersion region AR2 on the substrate P and has a liquid supply apparatus 11, which is able to send out the liquid LQ, and a supply port that is connected with the liquid supply apparatus 11 via a supply tube 12 and supplies the liquid LQ sent out from this liquid supply apparatus 11 onto the substrate P. The supply nozzle 13 is arranged near the surface of the substrate P.

The liquid supply apparatus 11 includes a tank that accommodates the liquid LQ, an pressurizing pump, etc. and it supplies the liquid LQ onto the substrate P via the supply tube 12 and the supply nozzle 13. In addition, the liquid supply operation of the liquid supply apparatus 11 is controlled by the control apparatus CONT, and the control apparatus CONT is able to control the volume of liquid supplied onto the substrate P per unit time by the liquid supply apparatus 11. Also, the liquid supply apparatus 11 has a temperature adjustment mechanism for the liquid LQ, and liquid LQ that is nearly the same temperature (for example, 23° C.) as the temperature inside of the chamber where the apparatus is accommodated is supplied onto the substrate P.

The liquid recovery mechanism 20 recovers the liquid LQ on the substrate P, and it has a recovery nozzle 23, which is arranged close to the surface of the substrate P without coming into contact with it, and a liquid recovery apparatus 21 that connects with this recovery nozzle 23 via a recovery tube 22. The liquid recovery apparatus 21 includes a vacuum system (suction apparatus) such as a vacuum pump and a tank that accommodates the recovered liquid LQ, and it recovers the liquid LQ on the substrate P via the recovery nozzle 23 and the recovery tube 22. The liquid recovery operation of the liquid recovery apparatus 21 is controlled by the control apparatus CONT, and the control apparatus CONT is able to control the liquid recovery volume per unit time by the liquid recovery apparatus 21.

During scanning exposure, the pattern image of a portion of the mask M is projected to the projection region AR1 directly under the optical element 2 of the front end of the projection optical system PL, and the substrate P moves in the +X direction (or the −X direction) at a velocity $\beta \cdot V$ ($\beta$ is the projection magnification) via the XY stage 52 in synchronization with the mask M moving in the −X direction (or the +X direction) at a velocity V with respect to the projection optical system PL. Then, after exposure of one shot region has ended, the next shot region moves to the scan start position by means of stepping motion of the substrate P, and exposure processing is sequentially performed to the respective shot regions by the step and scan method. In the present embodiment, the setting is such that the liquid LQ is caused to flow along the movement direction of the substrate P.

Figure 5:
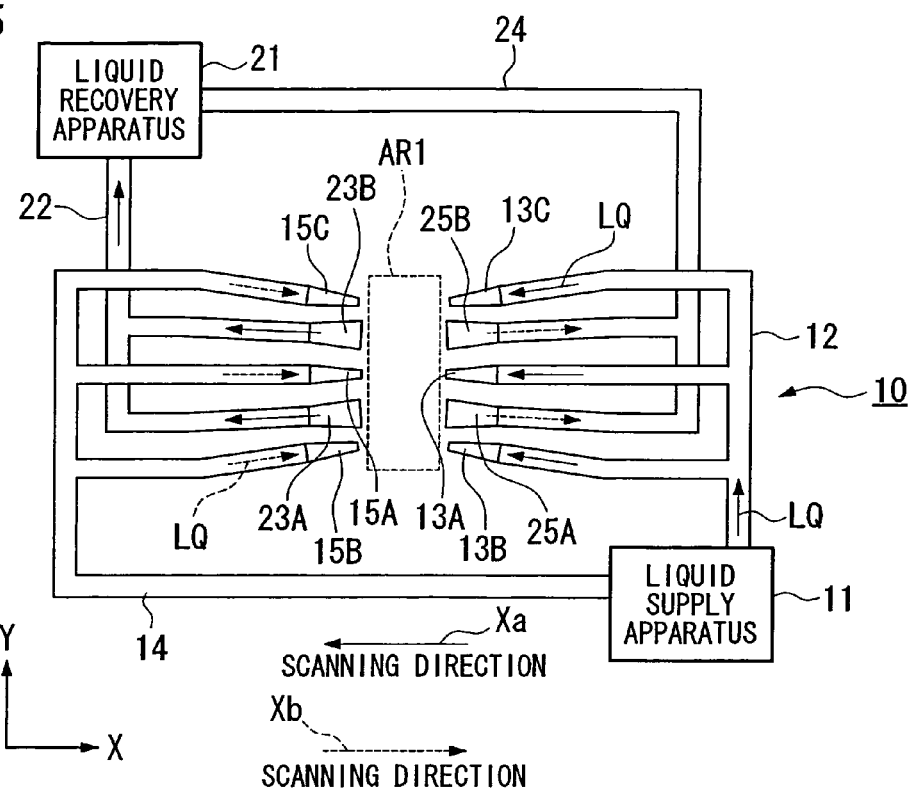
FIG. 5 is a drawing that shows an example of the arrangement of the supply nozzles and the recovery nozzles.

FIG. 5 is a drawing that shows the positional relationship between the projection region AR1 of the projection optical system PL, the supply nozzles 13 (13A-13C) that supply the liquid LQ in the X axis direction, and the recovery nozzles 23 (23A and 23B) that recover the liquid LQ. In FIG. 5, the shape of the projection region AR1 of the projection optical system PL is a long, narrow rectangle in the Y axis direction, three supply nozzles 13A-13C are arranged on the +X direction side so as to interpose that projection region AR1 in the X axis direction, and two recovery nozzles 23A and 23B are arranged on the −X direction side. In addition, the supply nozzles 13A-13C are connected to the liquid supply apparatus 11 via the supply tube 12, and the recovery nozzles 23A and 23B are connected to the liquid recovery apparatus 21 via the recovery tube 22. Also, supply nozzles 15A-15C and recovery nozzles 25A and 25B are arranged in a positional relationship in which the supply nozzles 13A-13C and the recovery nozzles 23A and 23B are rotated nearly 180°. The supply nozzles 13A-13C and the recovery nozzles 25A and 25B are alternately arrayed in the Y axis direction, and the supply nozzles 15A-15C and the recovery nozzles 23A and 23B are alternately arrayed in the Y axis direction, and the supply nozzles 15A-15C are connected to the liquid supply apparatus 11 via a supply tube 14, and the recovery nozzles 25A and 25B are connected to the liquid recovery apparatus 21 via a recovery tube 24.

Also, if the substrate P is moved in the scan direction (−X direction) shown by arrow Xa to perform scanning exposure, supply and recovery of the liquid LQ are performed by the liquid supply apparatus 11 and the liquid recovery apparatus 21 using the supply tube 12, the supply nozzles 13A-13C, the recovery tube 22 and the recovery nozzles 23A and 23B. That is, when the substrate P moves in the −X direction, as the liquid LQ is supplied onto the substrate P from the liquid supply apparatus 11 via the supply tube 12 and the supply nozzles 13 (13A-13B), the liquid LQ is recovered by the liquid recovery apparatus 21 via the recovery nozzles 23 (23A and 23B) and recovery tube 22, and the liquid LQ flows in the −X direction so that space between the projection optical system PL and the substrate P is filled. On the other hand, if the substrate P is moved in the scan direction (+X direction) shown by arrow Xb to perform scanning exposure, supply and recovery of the liquid LQ are performed by the liquid supply apparatus 11 and the liquid recovery apparatus 21 using the supply tube 14, the supply nozzles 15A-15C, the recovery tube 24 and the recovery nozzles 25A and 25B. That is, when the substrate P moves in the +X direction, as the liquid LQ is supplied onto the substrate P from the liquid supply apparatus 11 via the supply tube 14 and the supply nozzles 15 (15A-15C), the liquid LQ is recovered by the liquid recovery apparatus 21 via the recovery nozzles 25 (25A and 25B) and the recovery tube 24, and the liquid LQ flows in the +X direction so that space between the projection optical system PL and the substrate P is filled. In this way, the control apparatus CONT uses the liquid supply apparatus 11 and the liquid recovery apparatus 21 to cause the liquid LQ to flow along the movement direction of the substrate P in the same direction as the movement direction of the substrate P. In this case, the liquid LQ supplied from the liquid supply apparatus 11, for example, via the supply nozzle 13 flows so that it is pulled into the space between the projection optical system PL and the substrate P as it moves in the −X direction of the substrate P, so it is possible to easily supply the liquid LQ between the projection optical system PL and the substrate P even if the supply energy of the liquid supply apparatus 11 is low. In addition, by switching the direction in which the liquid LQ is caused to flow in accordance with the scan direction, it is possible to fill the space between the projection optical system PL and the substrate P with the liquid LQ even when the substrate P is scanned in the either +X direction or the −X direction, and it is possible to obtain high resolution and a large depth of focus.

Figure 6:
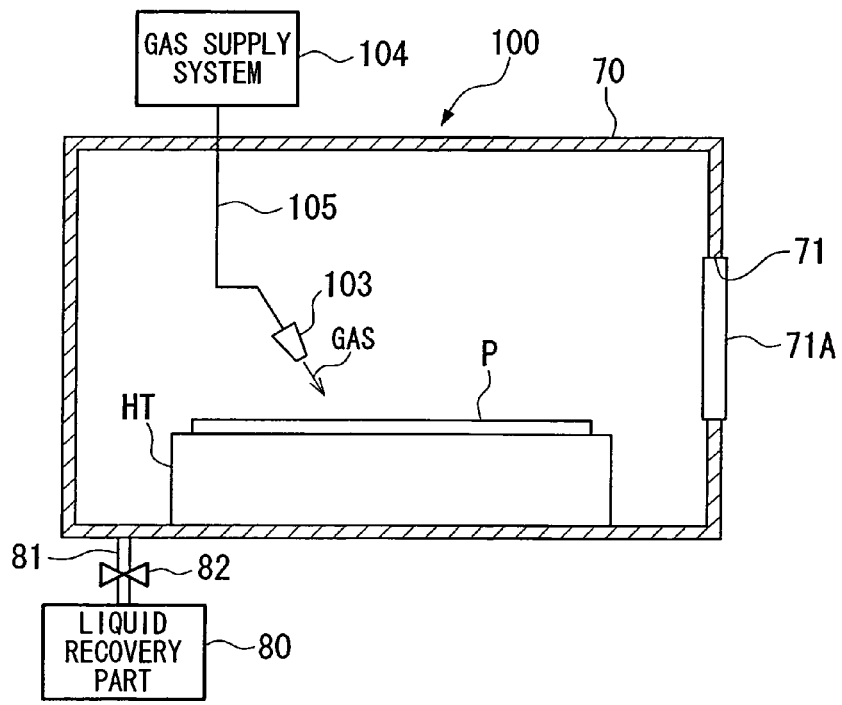
FIG. 6 is a drawing that schematically shows an example of the configuration of the liquid removal system.

FIG. 6 is a drawing that shows the liquid removal system 100. The second arm H2, which holds the post-liquid immersion exposure substrate P, approaches from the aperture part 71 to the interior of the cover member 70, in which a holding table HT is accommodated. At this time, the control apparatus CONT drives the shutter part 71A to open the aperture part 71. On the other hand, aperture part 72 is closed by the shutter part 72A. Then, before the substrate P is transferred to the holding table HT, a spray nozzle that is not shown in the drawing sprays gas on the rear surface of the substrate P to remove the liquid that is adhering to the rear surface of that substrate P. Next, the second arm H2 transfers the substrate P to the holding table HT, and the holding table HT holds the transferred substrate P by vacuum suction.

A spray nozzle 103 that forms a portion of the liquid removal system 100 is arranged inside the cover member 70, and a gas supply system 104 connects to the spray nozzle 103 via a flow path 105. A filter that removes foreign objects (debris and oil mist) in the gas to be sprayed to the substrate P is provided in the flow path 105. In addition, through the operation of the gas supply system 104, the prescribed gas is blown to the surface of the substrate P from the spray nozzle 103 via the flow path 105, and the liquid LQ that has adhered to the surface of the substrate P is blown off and removed by the blown gas.

A liquid recovery unit 80 is connected to the cover member 70 via a recovery tube 81. On the recovery tube 81, a valve 82 that opens and closes the flow path of that recovery tube 81 is provided. The liquid LQ that has been blown off of the substrate P is recovered by the liquid recovery unit 80 connected to the cover member 70. The liquid recovery unit 80 sucks in the gas inside the cover member 70 along with the scattered liquid LQ, and the liquid LQ that is blown off of the substrate P is recovered. Here, the liquid recovery unit 80 continuously performs the operation of suction of the gas inside the cover member 70 and the scattered liquid LQ. By doing so, the liquid LQ does not stay inside the cover member 70 on the inner walls and/or the bottom, etc. of the cover member 70, so the humidity inside the cover member 70 does not greatly fluctuate. In addition, even when the shutter parts 71A and 72A are opened, the damp gas inside the cover member 70 does not flow outside the cover member 70.

As explained above, in the device manufacturing system SYS of the present example, exposure processing based on the liquid immersion method is performed in the exposure apparatus main body EX. Even though liquid is adhering to the post-exposure processing substrate, that liquid is prevented from adhering to the pre-exposure processing substrate and/or to the first arm H1 that carries that substrate by means of the anti-scattering mechanism 110. As a result, deterioration of exposure accuracy due to liquid adhering to the pre-exposure processing substrate is prevented, and operational trouble and/or environmental changes due to liquid adhering to the first arm H1 are prevented. Therefore, exposure processing can be performed with high accuracy in this device manufacturing system SYS.

Figure 8A:
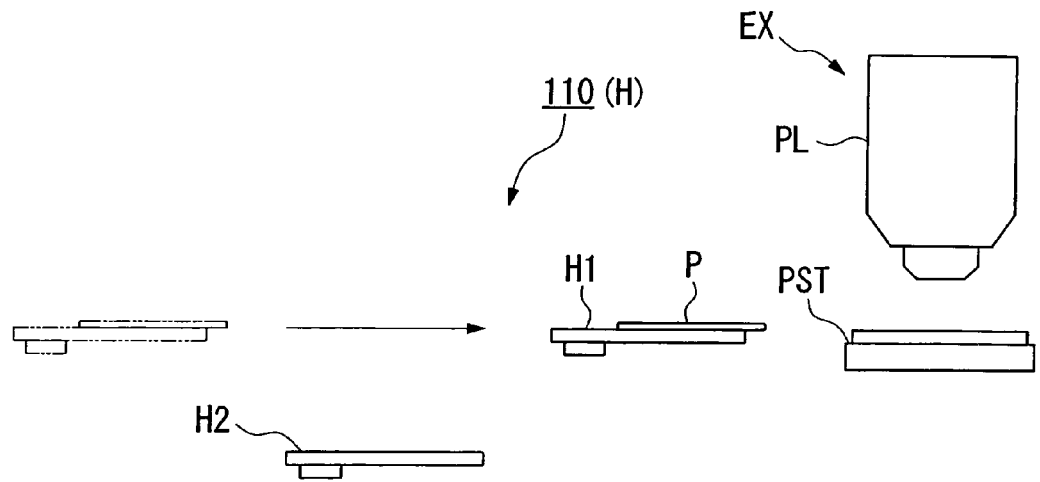
FIG. 8A is a drawing that schematically shows another example of the configuration of the anti-scattering mechanism.
Figure 8B:
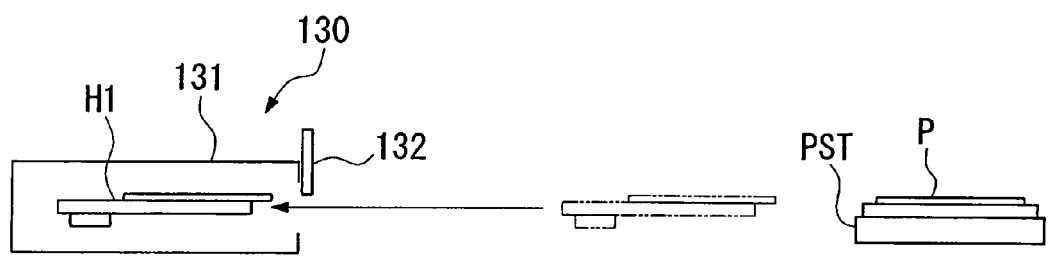
FIG. 8B is a drawing that schematically shows another example of the configuration of the anti-scattering mechanism.
Figure 8C:
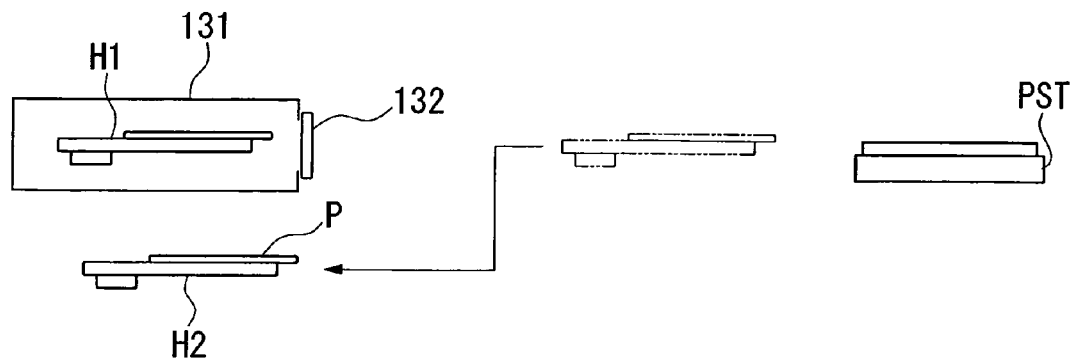
FIG. 8C is a drawing that schematically shows another example of the configuration of the anti-scattering mechanism.
Figure 9:
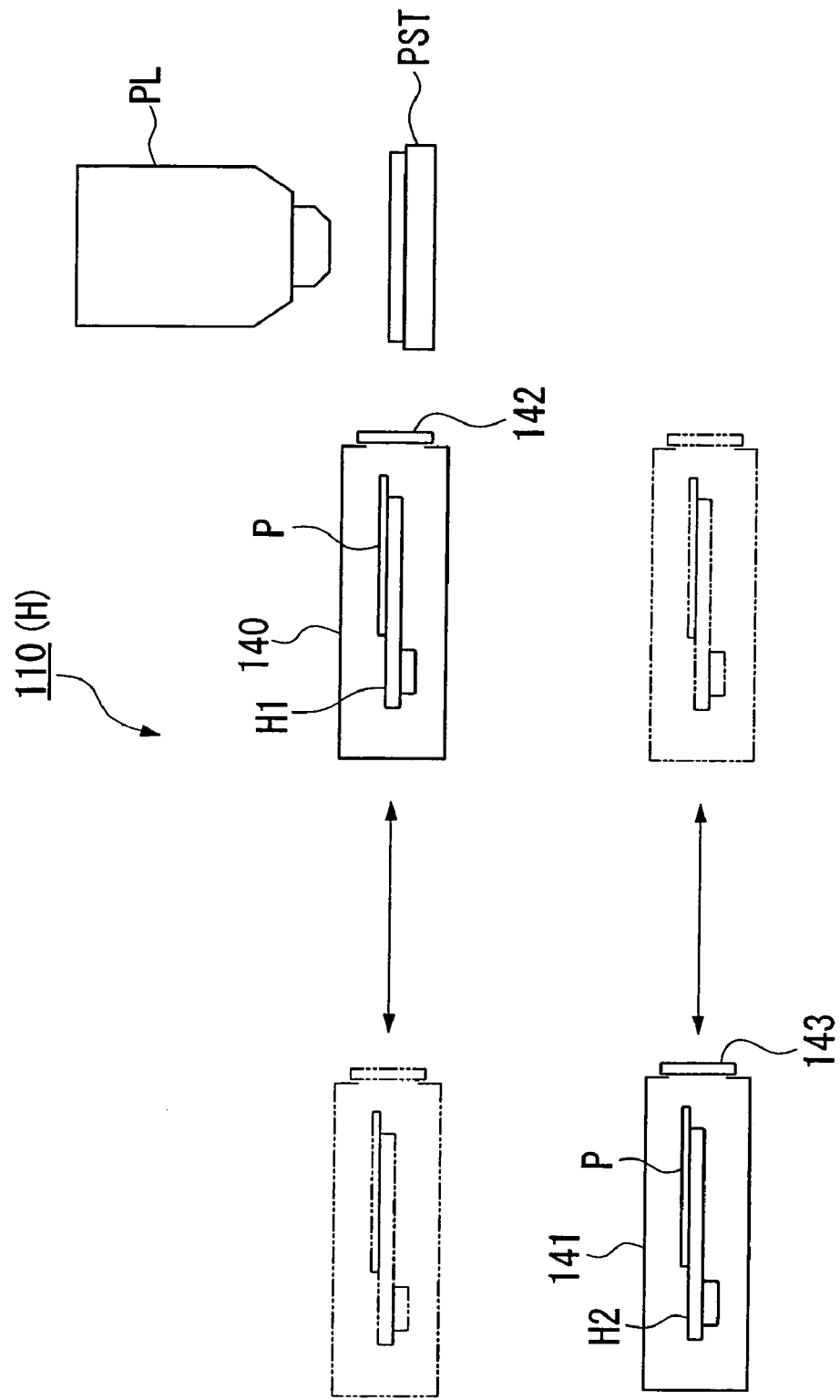
FIG. 9 is a drawing that schematically shows another example of the configuration of the anti-scattering mechanism.

FIG. 7-FIG. 9 show another example of the configuration of the anti-scattering mechanism 110.

The anti-scattering mechanism 110 of FIG. 7 is provided with a gas supply apparatus 121 and nozzles 123 that spray gas and connect to the gas supply apparatus 121 via piping 122. The nozzles 123 are arranged between the first arm H1 and the second arm H2, and are arranged in the movement direction of the arms H1 and H2. In addition, the nozzles 123 are arranged so that they blow gas downward. Here, it is possible to apply various configurations for the nozzles 123, such as those whose spray outlet is slit-shaped or those in which a plurality of holes are formed. In addition, provided in the piping 122 is a filter that is not shown in the drawing that removes impurities (particles or oil mist, etc.) in the gas. In the present example, dry air is used as the gas sprayed from the nozzles 123. In addition, other gases such as nitrogen gas and helium gas may be used.

In the anti-scattering mechanism 110 of FIG. 7, by activating the gas supply apparatus 121, and by blowing the gas through the nozzles 123, an air curtain is formed between the carrying space of the first arm H1 and the carrying space of the second arm H2. That is, a wall resulting from the flow of gas is formed between the carrying space of the first arm H1 and the carrying space of the second arm H2. As a result, in the carrying system H that is provided with this anti-scattering mechanism 110, even if liquid is scattered from the second arm H2 and/or the substrate being carried by the second arm H2, movement of that liquid is blocked by the air curtain, adherence of the liquid to the substrate being carried by the first arm H1 is prevented. The air curtain formation direction may be a direction of flow from the first arm H1 to the second arm H2 or the direction of movement of the first arm H1 and the second arm H2.

Note that, in the anti-scattering mechanism 110 of FIG. 7, liquid scattering is controlled by the air curtain, so there is an advantage in the simplification of the configuration and the ease making it more compact compared to the configuration in which scattering control is performed using a plate-shaped member such as that shown previously in FIG. 3. Note that air curtain formation may also be performed only when the probability of liquid scattering is high. For example, the air curtain may be formed only during carrying of the post-exposure processing substrate by the second arm H2.

The anti-scattering mechanism 110 shown in FIGS. 8A-C is provided with an isolation mechanism 130 that isolates the first arm H1 from the carrying path of the second arm H2. The isolation mechanism 130 is configured to include an accommodation container 131 that accommodates the second arm H2 and an opening and closing mechanism 132 that is provided on the accommodation container 131 and is for letting the second arm H2 in and out.

As shown in FIG. 8A, the first arm H1 carries the pre-exposure processing substrate (called it the first substrate) to the substrate stage PST. At the prealignment unit PAL, rough alignment of the next pre-exposure processing substrate (called it the second substrate) with respect to the substrate stage PST is performed while the first arm H1 is carrying the first substrate to the substrate stage PST. Then, the second substrate, which has been aligned by the prealignment part PAL, is loaded to the substrate stage PST by the first arm H1. When the second substrate is loaded by the first arm H1, the first substrate, which has been experienced to exposure processing, is unloaded from the substrate stage PST by the second arm H2. That is, when the first arm H1, which loads the second substrate, and the second arm H2, which unloads the first substrate, pass each other in the carrying path, there is concern that the liquid that has scattered from at least one of the second arm H2 and the first substrate carried by the second arm H2 will adhere to at least one of the first arm H1 and the second substrate carried by the first arm H1. To prevent the adherence of the liquid to at least one of the first arm H1 and the second substrate carried by the first arm H1, in the present example, as shown in FIG. 8B, the first arm H1 is withdrawn to the interior of the accommodation container 131 when the first arm H1 and the second arm H2 pass each other. After the second arm H2 has moved away from the accommodation container 131, that is, from the first arm H1, the first arm H1 comes out from the accommodation container 131 and again loads the second substrate to the substrate stage PST.

In this way, in the carrying system H of the present example, the first arm H1 is isolated inside the accommodation container 131 while the post-exposure processing substrate is being carried by the second arm H2. For this reason, the liquid that has scattered from the second arm H2 and the post-exposure processing substrate is prevented from adhering to at least one of the first arm H1 and the pre-exposure processing substrate.

Note that the method of isolating the first arm H1 from the carrying path of the second arm H2 is not limited to that described above. For example, it is not limited to a box-shaped container, and isolation of the first arm H1 may be performed using a member with another shape. Or, while the substrate is being carried by the second arm H2, the first arm H1 may be withdrawn with respect to the second arm H2, and the second arm H2 may be caused to standby at a position where the liquid will not scatter.

The anti-scattering mechanism 110 of FIG. 9 is provided with a first substrate accommodation container 140 that is provided on the first arm H1 and accommodates substrates, and a second substrate accommodation container 141 that is provided on the second arm H2 and accommodates substrates. The first substrate accommodation container 140 moves along with the first arm H1, and the second substrate accommodation container 141 moves along with the second arm H2. In addition, opening and closing mechanisms 142 and 143 for letting the substrates in and out are arranged on the respective accommodation containers 140 and 141. The opening and closing mechanisms 142 and 143 are arranged so as to open and close the aperture parts provided on the accommodation containers 141 and 140, and they are operated by a drive apparatus that is not shown in the drawing.

When the pre-exposure processing substrate is carried by the first arm H1, that substrate is accommodated in the first substrate accommodation container 140. The first substrate accommodation container 140 moves along with the first arm H1 while the substrate is being carried by the first arm H1. Note that transfer of the substrate is performed via an opening and closing mechanism 142 provided on the first substrate accommodation container 140. By carrying the pre-exposure processing substrate in a status in which it is accommodated in the first substrate accommodation container 140, the adherence of liquid to the pre-exposure processing substrate is prevented.

In addition, when the post-exposure processing substrate is carried by the second arm H2, that substrate is accommodated in the second substrate accommodation container 141. The second substrate accommodation container 141 moves along with the second arm H2, which carries the substrate, while the substrate is being carried by the second arm H2. Transfer of the substrate is performed via an opening and closing mechanism 143 provided on the second substrate accommodation container 141. By carrying the post-exposure processing substrate in a status in which it is accommodated in the second substrate accommodation container 141, the scattering of liquid to the vicinity from the post-exposure processing substrate is prevented.

In this way, in the anti-scattering mechanism 110 of FIG. 9, adherence of liquid to the pre-exposure processing substrate is prevented by the first substrate accommodation container 140, and scattering of liquid to the vicinity from the post-exposure processing substrate is prevented by the second substrate accommodation container 141. For this reason, adherence of liquid to the pre-exposure processing substrate is reliably prevented. In addition, in the present example, the respective accommodation containers 140 and 141 that control the scattering of the liquid move along with the arms H1 and H2, so there is little waste in the operation of carrying the substrate.

Note that, in the present example, substrate accommodation containers that accommodate substrates are provided on both the first arm H1 and the second arm H2, but the configuration may also be such that a substrate accommodation container is provided on only either one of the arms. In addition, the substrate accommodation containers are formed in a box shape, for example, to prevent the penetration and scattering of liquid, but this configuration may also be changed as desired. Also, the configuration may also be such that an air curtain is formed in the aperture part of the substrate accommodation container instead of opening and closing mechanisms for letting the substrates in and out. In a configuration in which an air curtain is formed in the aperture part, the sliding mechanism can be omitted, and there is an advantage in control of cleanliness.

Figure 10:
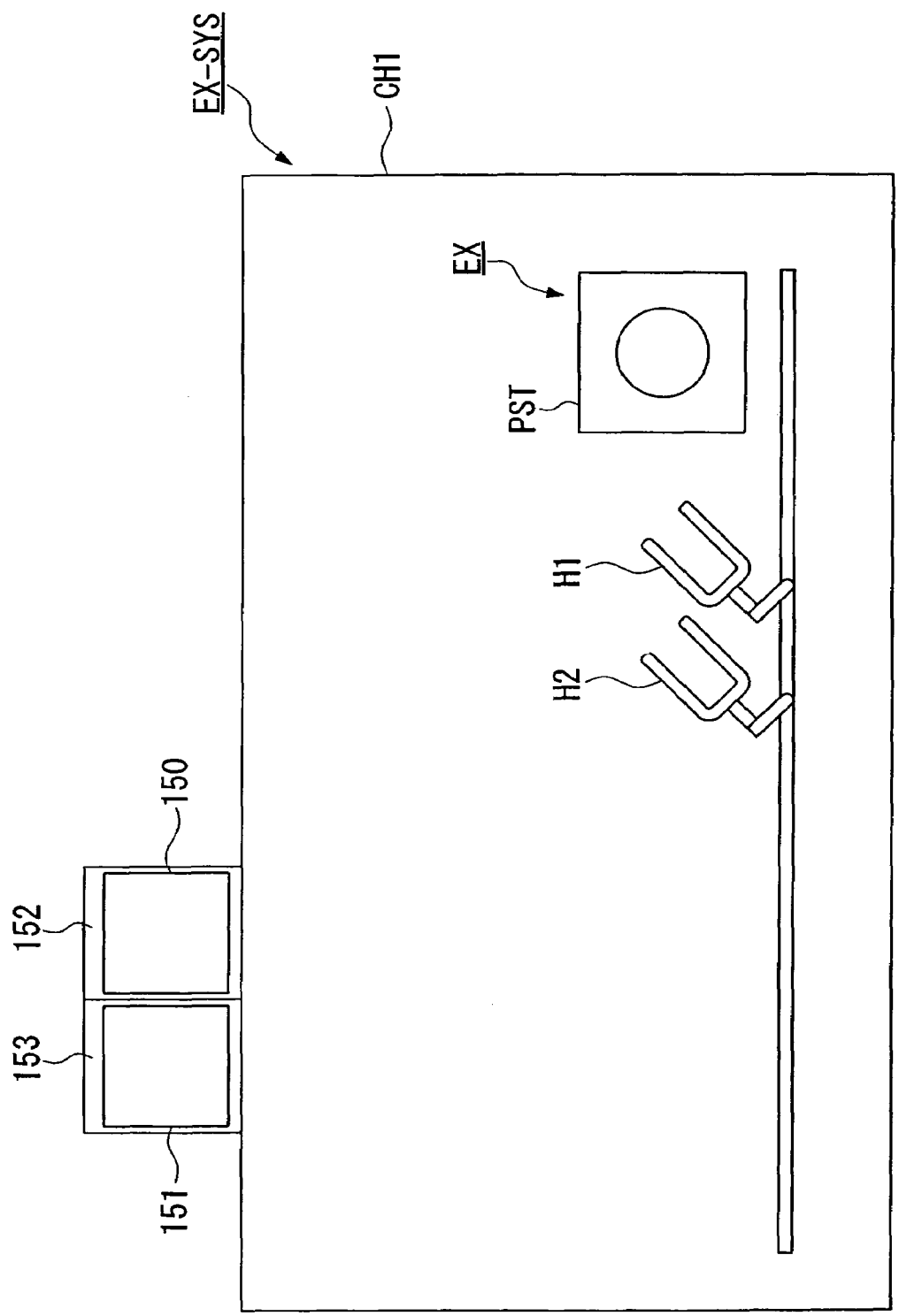
FIG. 10 is a drawing that schematically shows an example of the configuration in the case where a substrate cassette is used.

FIG. 10 shows an example of the configuration in the case where substrate transfer to the exposure apparatus EX-SYS is performed via substrate cassettes 150 and 151. Here, the substrate cassettes 150 and 151 are respectively formed so that a plurality of substrates can be accommodated, and they are used in such cases as when a plurality of substrates are to be carried all at once or one at a time during a plurality of exposure processing processes or in test exposure processing.

In the exposure apparatus EX-SYS of the present example, installation parts 152 and 153 for installing the substrate cassettes 150 and 151 are provided. The substrate cassette 150 for accommodating pre-exposure processing substrates is installed in installation part 152, and the substrate cassette 151 for accommodating post-exposure processing substrates, that is, substrates to which liquid has adhered, is installed in installation part 153. Specifically, in the present example, the substrate cassettes are used for pre-exposure processing and post-exposure processing, separately.

In the exposure apparatus EX-SYS of FIG. 10, the pre-exposure processing substrates P are taken out one at a time from the substrate cassette 150 which is installed on the installation part 152. The first arm H1 takes that substrate P from the substrate cassette 150 and carries (loads) the substrate P to the substrate stage PST. The post-liquid immersion exposure substrate P is carried from the substrate stage PST by the second arm H2. When the second arm H2 holds the post-liquid immersion exposure substrate P from the substrate stage PST, it accommodates (unloads) that substrate P in the substrate cassette 151 installed on installation part 153. When the prescribed number of substrates has been accommodated in the substrate cassette 151, that substrate cassette 151 is sent to, for example, an apparatus for development processing.

In this way, in the exposure apparatus EX-SYS of the present example, the post-liquid immersion exposure substrates are returned to the substrate cassette 151 that is separate from the substrate cassette 150 that accommodates the pre-exposure processing substrates. By doing so, scattering of the liquid that has adhered to the post-liquid immersion exposure substrates to the pre-exposure processing substrates is prevented.

Note that, in the exposure apparatus EX-SYS of the present example, if a liquid removal system for removing liquid that has adhered to the substrate, such as that previously described, is provided, that substrate may be sent to the substrate cassette 150 after the liquid of the post-liquid immersion exposure substrate has been removed. In addition, if a liquid removal system is provided, a substrate for which the liquid has been removed by the liquid removal system may be returned to the substrate cassette 151 that accommodates the pre-exposure processing substrates, and a substrate to which liquid has adhered may be returned to the other substrate cassette 151 without going via the liquid removal system.

Figure 11:
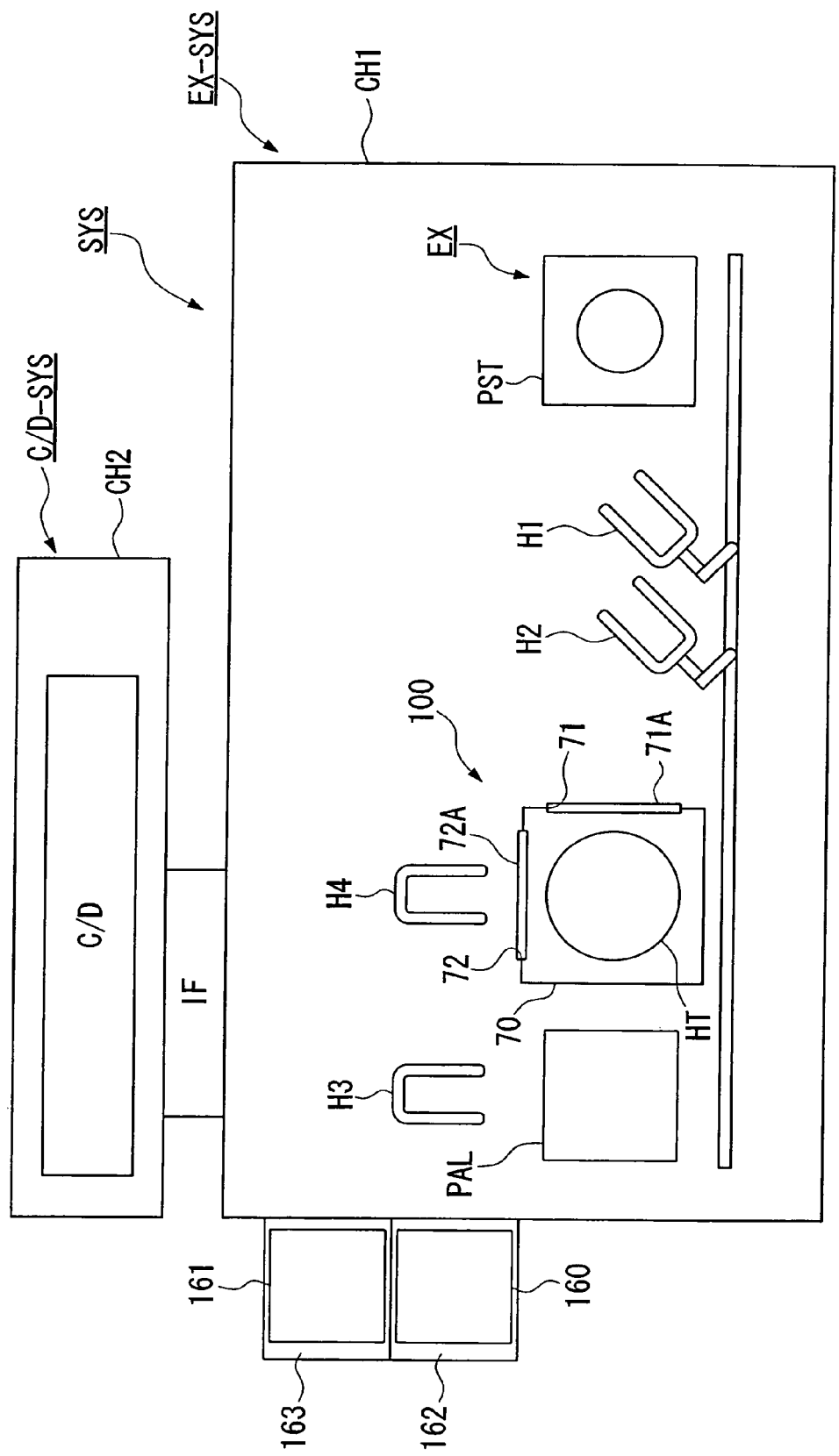
FIG. 11 is a drawing that schematically shows another example of the configuration in the case where a substrate cassette is used.

FIG. 11 shows an example of a configuration in which installation parts 162 and 163 of substrate cassettes 160 and 161 are provided in the exposure apparatus EX-SYS shown in FIG. 2. The substrate cassette 160, which accommodates substrates P sent from the load system (first arm H1, third arm H3, etc.), is installed in installation part 162, and the substrate cassette 161, which accommodates substrates P sent from the unload system (second arm H2, fourth arm H4, etc.), is installed in installation part 163.

In the exposure apparatus EX-SYS of FIG. 11, for example, when a nonconformity such as deterioration of image formation performance has occurred, the substrate cassettes 160 and 161 are used. Specifically, at the time of the occurrence of a nonconformity, the substrates P held by the load system (first arm H1, third arm H3, etc.) are recovered to the substrate cassette 160, and the substrates P held by the unload system (second arm H2, fourth arm H4, etc.) are recovered to the substrate cassette 161. At the time of the occurrence of a nonconformity, the substrates P held by the load system are pre-exposure processing substrates, so there is a high probability that liquid is not adhering, but the substrates P held by the unload system are post-exposure processing substrate, so there is a high probability that liquid is adhering. For this reason, as in the present example, by separately using the substrate cassettes that recover the substrates from the load system and unload system, scattering of liquid from the substrates recovered from the unload system to the pre-exposure processing substrates recovered from the load system is prevented. By doing so, reutilization of substrates recovered from the load system can be pursued.

In this configuration, if the aforementioned liquid removal system is provided, there may be recovery to the substrate cassette 161 after the liquid that has adhered to the substrate has been removed by the liquid removal system.

However, when exposure processing is performed again on the recovered substrate P, there are cases in which it is preferable that they be in a status in which liquid has adhered to the surface of the substrate to quickly perform exposure processing. In such cases, there may be recovery to the substrate cassette 161 without going via the liquid removal system.

Furthermore, in this configuration, if a detection mechanism that detects whether or not liquid has adhered onto the surface of the substrate is provided instead of the liquid removal system, the substrate cassette 160 that recovers the substrates may be appropriately used based on the detection results of the detection mechanism.

Here, with respect to the exposure processing by the liquid immersion method, in the present embodiment, the liquid LQ used in exposure processing is purified water. Purified water has advantages in that it can be easily obtained in large quantity at semiconductor fabrication plants, etc. and in that it has no adverse effects on the photoresist on the substrate P or on the optical elements (lenses), etc.

In addition, purified water has no adverse effects on the environment and contains very few impurities, so one can also expect an action whereby the surface of the substrate P and the surface of the optical element provided on the front end surface of the projection optical system PL are cleaned.

In addition, the index of refraction n of purified water (water) with respect to exposure light EL with a wavelength of approximately 193 nm is nearly 1.44, so in the case where ArF excimer laser light (193 nm wavelength) is used as the light source of the exposure light EL, on the substrate P, it is possible to shorten the wavelength to 1/n, that is, approximately 134 nm, to obtain high resolution. Also, the depth of focus is expanded by approximately n times, that is approximately 1.44 times, compared with it being in air, so in the case where it would be permissible to ensure the same level of depth of focus as the case in which it is used in air, it is possible to further increase the numerical aperture of the projection optical system PL, and resolution improves on this point as well.

In the present embodiment, the lens 2 is attached to the front end of the projection optical system PL, and the optical element attached to the front end of the projection optical system PL may also be an optical plate used in adjustment of the optical characteristics of the projection optical system PL, for example, aberration (spherical aberration, comatic aberration, etc.). Or, it may be a parallel flat surface plate that is able to transmit exposure light EL.

In addition, in the case where the pressure between the substrate P and the optical element of the front end of the projection optical system PL produced by the flow of the liquid LQ is high, that optical element is not made replaceable, but the optical element is fixed securely so that it is not moved by the pressure.

In addition, in the present embodiment, the configuration is such that the space between the projection optical system PL and the surface of the substrate P is filled with a liquid LQ, but it may be, for example, a configuration in which liquid LQ is filled in a status in which a cover glass consisting of a parallel flat plate is attached to the surface of the substrate P.

If $F_2$ laser light is used as the exposure light EL, a fluorine group liquid, for example, a fluorocarbon oil or a perfluoropolyether (PFPE), that is able to transmit $F_2$ laser light may be used as the liquid LQ.

Note that, applicable as the substrate P of the aforementioned respective embodiments are not only a semiconductor wafer for the manufacture of semiconductor devices but glass substrates for display devices, ceramic wafers for thin film magnetic heads, or mask or reticle base plates, etc. (synthetic quartz, silicon wafer) used in exposure apparatuses.

In addition, in the embodiments described above, an exposure apparatus that locally fills the space between the projection optical system PL and the substrate P with liquid is employed, but the present invention may also be applied to a liquid immersion exposure apparatus which moves the stage that holds the substrate subject to exposure in a liquid bath, such as that disclosed in Japanese Unexamined Patent Application Publication No. H6-124873, and to a liquid immersion exposure apparatus that forms a liquid pool of a prescribed depth on a stage and holds the substrate therein, such as that disclosed in Japanese Unexamined Patent Application Publication No. H10-303114.

Applicable as the exposure apparatus EX (exposure apparatus main body) EX are, in addition to step and scan system scanning exposure apparatuses (scanning steppers) that move the mask M and the substrate P in synchronization and scan expose the pattern of a mask M, step and repeat system projection exposure apparatuses (steppers) that expose the pattern of the mask M all at once in a status in which the mask M and the substrate P have been made stationary and sequentially step move the substrate P. In addition, the present invention is also applicable to step and switch system exposure apparatuses in which at least two patterns are transferred onto the substrate P in a partially overlapping manner.

The types of exposure apparatuses EX are not limited to exposure apparatuses for semiconductor device fabrication that expose a semiconductor device pattern onto a substrate P but are also widely applicable to exposure apparatuses for the manufacture of liquid crystal display elements and for the manufacture of displays, and exposure apparatuses for the manufacture of thin film magnetic heads, image pickup elements (CCDs) or reticles or masks.

In the case where a linear motor is used in the substrate stage PST or the mask stage MST (see U.S. Pat. No. 5,623,853 or U.S. Pat. No. 5,528,118), an air floating type that uses air bearings or a magnetic levitation type that uses Lorentz's force or reactance force may be used. In addition, the respective stages PST, MST may be the types that move along a guide or may be the guideless type in which a guide is not provided.

For the drive mechanisms of the respective stages PST, MST, a planar motor that places in opposition a magnet unit that two-dimensionally arranges magnets and an armature unit that arranges coils two-dimensionally and drives the respective stages PST, MST by electromagnetic force may be used. In such a case, either the magnet unit or the armature unit is connected to the stage PST, MST, and the other from among the magnet unit and the armature unit may be provided on the moving surface side of the stage PST, MST.

The reaction force generated by the movement of the substrate stage PST may be caused to mechanically escape to the floor (ground) using a frame member so that it is not transmitted to the projection optical system PL as described in Japanese Unexamined Patent Application Publication No. H8-166475 (U.S. Pat. No. 5,528,118). The reaction force generated by the movement of the mask stage MST may be caused to mechanically escape to the floor (ground) using a frame member so that it is not transmitted to the projection optical system PL, as described in Japanese Unexamined Patent Application Publication No. H8-330224 (U.S. Ser. No. 08/416,558).

In the above way, the exposure apparatus EX of the present embodiment is manufactured by assembling various subsystems, including the respective constituent elements presented in the claims of the present application, so that the prescribed mechanical precision, electrical precision and optical precision are maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly to the exposure apparatuses of the various subsystems has ended, overall adjustment is performed, and the various precisions are ensured for the exposure apparatus as a whole. Note that it is preferable that the manufacture of the exposure apparatus be performed in a clean room in which the temperature, the degree of cleanliness, etc. are controlled.

Figure 12:
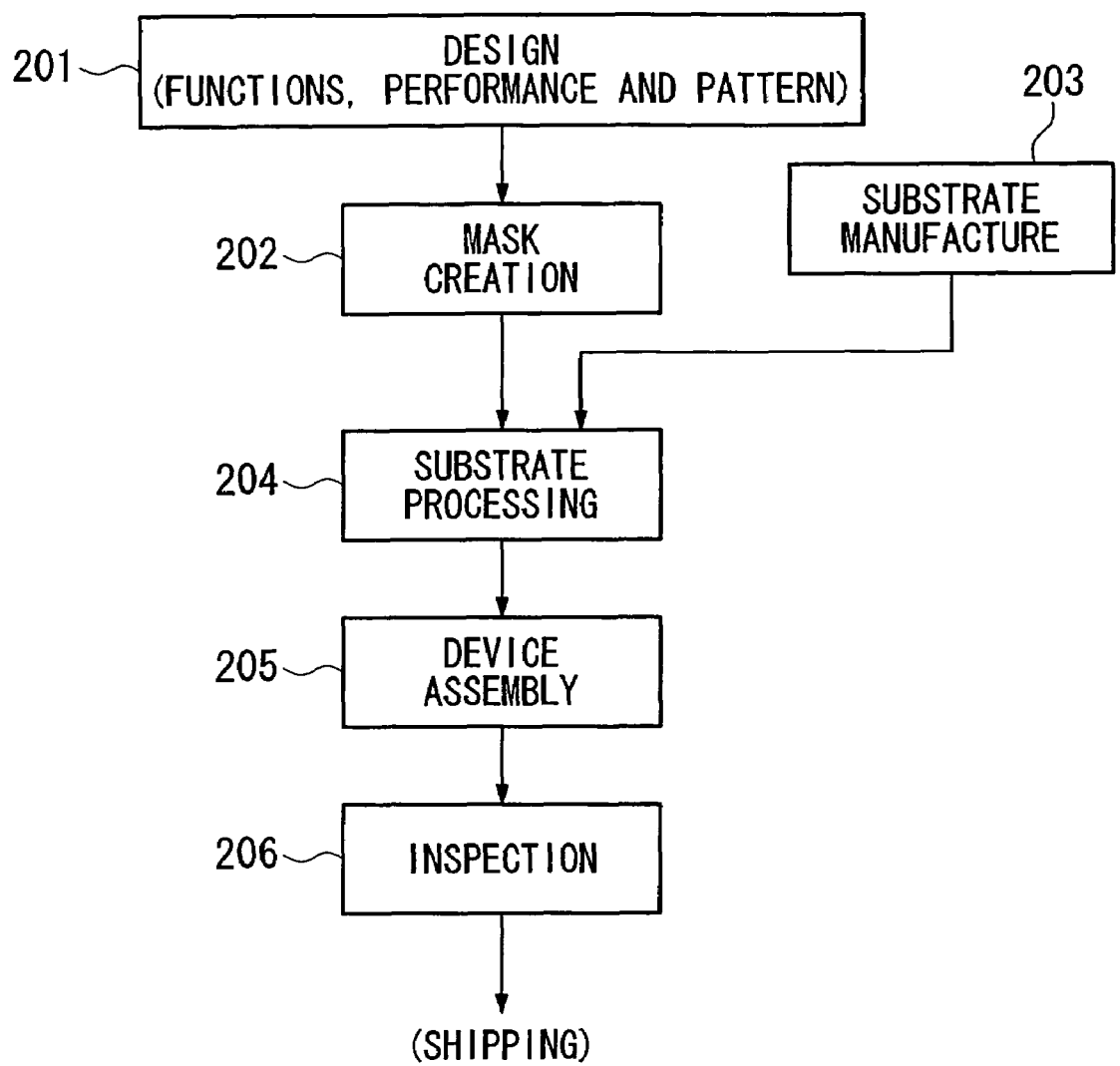
FIG. 12 is a flow chart that shows an example of the semiconductor device manufacturing process.

As shown in FIG. 12, microdevices such as semiconductor devices are manufactured by going through a step 201 that performs microdevice function and performance design, a step 202 that creates the mask (reticle) based on this design step, a step 203 that manufactures the substrate that is the device base material, an exposure processing step 204 that exposes the pattern of the mask onto a substrate by means of the exposure apparatus EX of the aforementioned embodiment, a device assembly step (including the dicing process, bonding process and packaging process) 205, an inspection step 206, etc.

A preferred embodiment relating to the present invention has been explained above while referring to the attached drawings, but the present invention is, of course, not limited to the relevant example. It is clear that persons skilled in the art would be able to conceive of various examples of changes and examples of corrections within the scope of the technical concepts described in the claims, and it is understood that these are also, of course, included within the technical scope of the present invention.

What is claimed is:

1. A substrate carrying apparatus, comprising:
   a first carrying system that carries a substrate into an exposure processing unit that performs exposure processing via a projection optical system and a liquid;
   a second carrying system that carries a substrate from the exposure processing unit; and
   an anti-scattering device that controls scattering of the liquid from at least one of the second carrying system and the substrate carried by the second carrying system to at least one of the first carrying system and the substrate carried by the first carrying system.

2. A substrate carrying apparatus according to claim 1, wherein the anti-scattering device has a partition member provided between the carrying space of the first carrying system and the carrying space of the second carrying system.

3. A substrate carrying apparatus according to claim 2, wherein the partition member has an aperture part, which connects at least a portion of the carrying space of the first carrying system and the carrying space of the second carrying system, and the anti-scattering device has an opening and closing member that opens and closes the aperture part of the partition member.

4. A substrate carrying apparatus according to claim 1, wherein the anti-scattering device has an isolation device that, while the second carrying system carries the substrate, isolates the first carrying system from the carrying path of the second carrying system.

5. A substrate carrying apparatus according to claim 1, wherein the anti-scattering device forms a gas curtain between the carrying space of the first carrying system and the carrying space of the second carrying system.

6. A substrate carrying apparatus according to claim 1, wherein the anti-scattering device has a first substrate accommodation container that is provided on the first carrying system and accommodates the substrate before the substrate is subjected to a liquid immersion exposure.

7. A substrate carrying apparatus according to claim 6, wherein the first substrate accommodation container has an opening and closing device for letting the substrate in and out.

8. A substrate carrying apparatus according to claim 1, wherein the anti-scattering device has a second substrate accommodation container that is provided on the second carrying system and accommodates the substrate after the substrate is subjected to a liquid immersion exposure.

9. A substrate carrying apparatus according to claim 8, wherein the second substrate accommodation container has an opening and closing device for letting the substrate in and out.

10. An exposure apparatus comprising:
an exposure processing unit including a projection optical system which projects an image of a pattern formed on a mask onto a substrate through a liquid; and
a substrate carrying apparatus defined in claim 1 by which the substrate is carried into the exposure processing unit and the substrate is carried from the exposure processing unit.

11. A device manufacturing method comprising:
exposing a substrate using an exposure apparatus defined in claim 10; and developing the exposed substrate.

12. A substrate carrying apparatus that carries a substrate and that is used in a liquid immersion lithography in which a substrate is exposed to a pattern image via a projection optical system and a liquid, comprising:
a first carrying system that carries a pre-exposure substrate;
a second carrying system that carries a post-exposure substrate;
a first accommodation container into which the pre-exposure substrate is carried from the first carrying system, the first accommodation container accommodating the pre-exposure substrate to which the liquid is not adhered;
a second accommodation container into which the post-exposure substrate is carried from the second carrying system, the second accommodation container accommodating the post-exposure substrate to which the liquid may be adhering; and
an anti-scattering device that controls scattering of the liquid from at least one of the second carrying system and the post-exposure substrate carried by the second carrying system to at least one of the first carrying system and the pre-exposure substrate carried by the first carrying system.

13. An exposure apparatus comprising:
a substrate holder on which a substrate is held;
a projection optical system which projects a pattern image onto the substrate held on the substrate holder through a liquid; and
a substrate carrying apparatus defined in claim 12.

14. A device manufacturing method comprising:
exposing a substrate using an exposure apparatus defined in claim 13; and
developing the exposed substrate.

15. A substrate carrying apparatus, comprising:
a first carrying system by which a substrate is loaded onto a substrate holder;
a second carrying system by which a substrate is unloaded from the substrate holder; and
an anti-scattering device that prevents a liquid from scattering from at least one of the second carrying system and the substrate carried by the second carrying system to at least one of the first carrying system and the substrate carried by the first carrying system.

16. A substrate carrying apparatus according to claim 15, wherein the anti-scattering device has a partition member provided between the carrying space of the first carrying system and the carrying space of the second carrying system.

17. A substrate carrying apparatus according to claim 15, wherein the anti-scattering device forms a gas curtain between the carrying space of the first carrying system and the carrying space of the second carrying system.

18. A substrate carrying apparatus according to claim 15, wherein the first carrying system is allowed to carry a substrate to a first accommodation container that accommodates the substrate, and the second carrying system is allowed to carry a substrate to a second accommodation container that accommodates the substrate.

19. A substrate carrying apparatus according to claim 15, further comprising:
a liquid removing system by which a liquid is removed from the exposed substrate.

20. A substrate carrying apparatus according to claim 15, further comprising:
a liquid detecting device which detects whether a liquid exists on the exposed substrate.

21. An exposure apparatus comprising:
a substrate holder on which a substrate is held;
a projection optical system which projects a pattern image onto the substrate held on the substrate holder through a liquid; and
a substrate carrying apparatus defined in claim 15 by which the substrate is loaded onto the substrate holder and the substrate is unloaded from the substrate holder.

22. A device manufacturing method comprising:
exposing a substrate using an exposure apparatus defined in claim 21; and
developing the exposed substrate.

* * * * *